(12) United States Patent
Mouchon et al.

(10) Patent No.: US 8,977,190 B2
(45) Date of Patent: Mar. 10, 2015

(54) LINEARIZER-CHANNEL AMPLIFIER DEVICE FOR A DUAL RF CHANNEL, AND TELECOMMUNICATION SATELLITE COMPRISING SAID DEVICE

(75) Inventors: Gregory Mouchon, Muret (FR); Jean Maynard, Ramonville Saint Agne (FR); Raoul Rodriguez, Bruguieres (FR); Pierre Jaubert, Les Vigneaux (FR)

(73) Assignee: Thales, Neuilly sur Seine (FR)

( * ) Notice: Subject to any disclaimer, the term of this patent is extended or adjusted under 35 U.S.C. 154(b) by 390 days.

(21) Appl. No.: 13/393,125

(22) PCT Filed: Aug. 10, 2010

(86) PCT No.: PCT/EP2010/061641
§ 371 (c)(1),
(2), (4) Date: Feb. 28, 2012

(87) PCT Pub. No.: WO2011/023534
PCT Pub. Date: Mar. 3, 2011

(65) Prior Publication Data
US 2012/0156988 A1 Jun. 21, 2012

(30) Foreign Application Priority Data
Aug. 28, 2009 (FR) ..................................... 09 04108

(51) Int. Cl.
*H03F 3/68* (2006.01)
*H03F 1/32* (2006.01)
*H03F 3/189* (2006.01)
*H04B 7/15* (2006.01)
*H04B 7/185* (2006.01)

(52) U.S. Cl.
CPC .. *H03F 3/68* (2013.01); *H03F 1/32* (2013.01); *H03F 3/189* (2013.01); *H04B 7/15* (2013.01); *H04B 7/18515* (2013.01)

USPC ......... 455/12.1; 455/13.1; 455/427; 455/429; 455/3.01

(58) Field of Classification Search
CPC ............................................... H04B 2001/0425
USPC ....................................... 455/13.4, 12.1, 11.1
See application file for complete search history.

(56) References Cited

U.S. PATENT DOCUMENTS

| | | | | |
|---|---|---|---|---|
| 7,139,526 B2 * | 11/2006 | Nicol et al. | ................... | 455/13.4 |
| 7,542,716 B2 * | 6/2009 | Bell et al. | ...................... | 455/3.02 |
| 7,991,348 B2 * | 8/2011 | Norin et al. | ................... | 455/3.02 |
| 8,005,121 B2 * | 8/2011 | McNeely | ....................... | 370/535 |
| 8,077,760 B2 * | 12/2011 | Chen | .............................. | 375/211 |
| 8,855,013 B2 * | 10/2014 | Le Boulc'H et al. | .......... | 370/254 |
| 8,855,552 B2 * | 10/2014 | Dankberg et al. | ............ | 455/12.1 |
| 2004/0185775 A1 * | 9/2004 | Bell et al. | ...................... | 455/12.1 |

FOREIGN PATENT DOCUMENTS

EP     1478088 A2    11/2004

* cited by examiner

*Primary Examiner* — Tilahun B Gesesse
(74) *Attorney, Agent, or Firm* — Baker & Hostetler LLP

(57) ABSTRACT

A linearizer-channel amplifier device for a dual RF channel designed to be installed on a telecommunication satellite comprises two independent radiofrequency channels, each radiofrequency channel corresponding to a radiofrequency-signal communication channel and comprising a channel-amplifier module, the two radiofrequency channels being connected to one and the same remote control and telemetry module designed to route and to manage remote control signals dedicated to each of the two channel-amplifier modules and to manage telemetries produced by the two channel-amplifier modules. For application notably to the field of satellite telecommunications and in particular to the radiofrequency transmission systems of satellite repeaters.

8 Claims, 2 Drawing Sheets

LINEARIZER-CHANNEL AMPLIFIER DEVICE FOR A DUAL RF CHANNEL, AND TELECOMMUNICATION SATELLITE COMPRISING SAID DEVICE

CROSS-REFERENCE TO RELATED APPLICATIONS

This application is a National Stage of International patent application PCT/EP2010/061641, filed on Aug. 10, 2010, which claims priority to foreign French patent application No. FR 0904108, filed on Aug. 28, 2009, the disclosures of which are incorporated by reference in their entirety.

FIELD OF THE INVENTION

The present invention relates to a linearizer-channel amplifier device for a dual RF channel and a telecommunication satellite comprising this device. It applies notably to the field of satellite telecommunications and in particular to radiofrequency transmission systems of satellite repeaters.

BACKGROUND

In most payload architectures, the repeaters installed on the satellites comprise a large number of independent RF radiofrequency channels each comprising an item of equipment for preamplifying the radiofrequency signals received by the repeater, said equipment being designed to provide the power required at the input of a traveling wave tube. This traveling wave tube is a microwave-frequency power amplifier used to retransmit the received signals to a subscriber. It is made to operate close to its saturation power, which causes a nonlinear response from the tube, this nonlinear response being able to be corrected by a linearizer function that may be installed in the item of preamplification equipment placed upstream of the tube, the item of preamplification equipment then being called a linearizer channel amplifier.

The linearizer-channel amplifier device dedicated to each RF system comprises an amplifier module, possibly a linearizer module and a remote control and telemetry module. The remote control and telemetry module controls the linearizer-channel amplifier device and manages the telecommunications with a ground station. The remote control and telemetry module comprises a remote control portion which programs the amplifier module and the linearizer in order to adapt it to the conditions of use determined by the traffic of data to be transmitted and in general by the requirements specific to the link budget, and a telemetry portion responsible for managing and transmitting the measurements made by the linearizer-channel amplifier device to the ground station. The remote control and telemetry module may also manage and transmit telemetries originating from other items of equipment of the satellite such as, for example, those of the system for powering the traveling wave tubes.

Since the repeaters comprise a large number of channels each comprising a dedicated linearizer-channel amplifier device and since each linearizer-channel amplifier device comprises several independent modules, this architecture has problems of space requirement and production cost, all the greater since there is a large number of channels.

SUMMARY OF THE INVENTION

The object of the invention is to produce a linearizer-channel amplifier device comprising a reduced number of components and making it possible to reduce the production cost and the space requirement of each RF system.

For this, the invention relates to a linearizer-channel amplifier device for a dual RF channel designed to be installed on a telecommunication satellite, characterized in that it comprises two independent radiofrequency channels, each radiofrequency channel corresponding to a radiofrequency-signal communication channel and comprising a channel-amplifier module, the two radiofrequency channels being connected to one and the same remote control and telemetry module providing the routing and the management of the signals dedicated to each of the two radiofrequency channels.

Advantageously, the remote control and telemetry module provides the routing and the management of the remote control signals dedicated to each of the two channel-amplifier modules and the management of the telemetries produced by the two channel-amplifier modules.

If necessary, each radiofrequency channel also comprises a linearizer connected to the respective channel-amplifier module and to the remote control and telemetry module and the remote control and telemetry module also manages telemetries produced by the two linearizers.

Advantageously, the remote control and telemetry module comprises a serial or parallel communication bus, common to the two radiofrequency channels.

Preferably, the remote control and telemetry module comprises a single physical address for all the remote control and telemetry signals relating to the two radiofrequency channels.

Advantageously, the remote control and telemetry module also comprises remote control outputs connected to the input of a dual electronic power conditioner, or of two electronic power conditioners, connected to two traveling wave tubes associated with each radiofrequency channel. In this case, the remote control and telemetry module also comprises a management system for managing the analog and digital telemetries of each power conditioner via one or more dedicated interfaces.

The invention also relates to a telecommunication satellite comprising at least one linearizer-channel amplifier device for a dual RF channel.

BRIEF DESCRIPTION OF THE DRAWINGS

Other particular features and advantages of the invention will clearly appear in the rest of the description given as a purely illustrative and nonlimiting example, with reference to the appended schematic drawings which represent.

DETAILED DESCRIPTION

Figure 1:
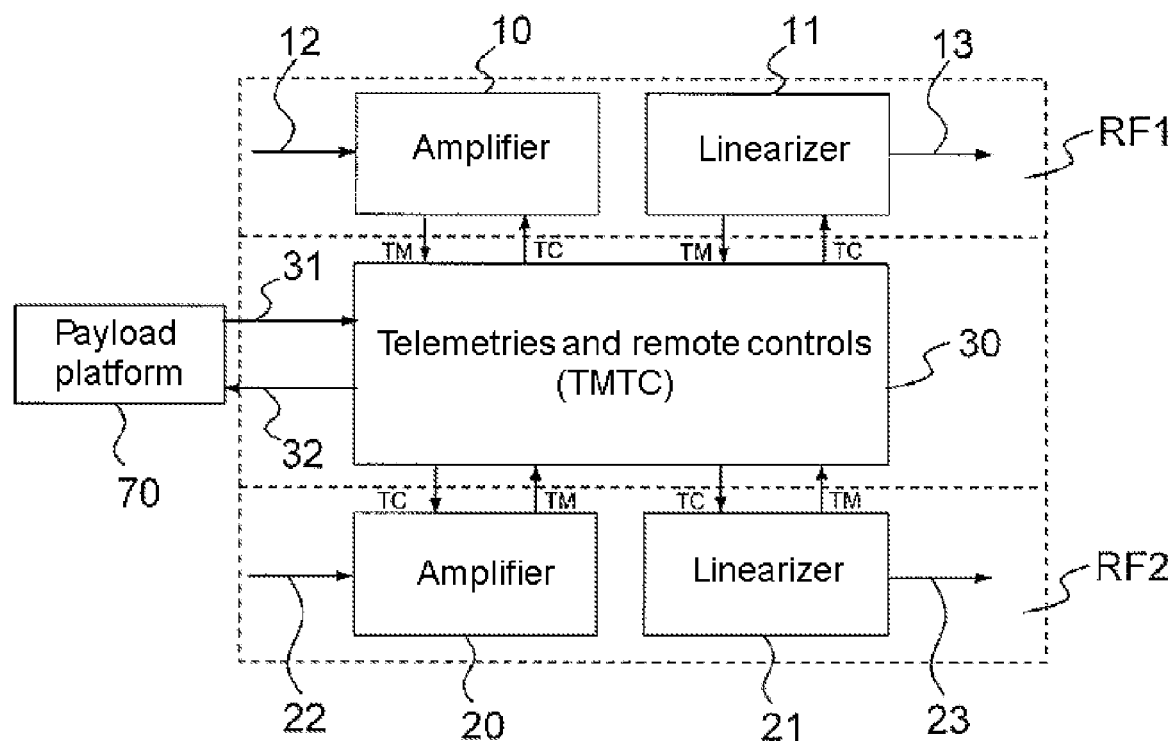
FIG. 1: a line diagram of an example of a linearizer-channel amplifier device for a dual RF channel according to the invention.

The line diagram of the linearizer-channel amplifier device for a dual RF channel shown in FIG. 1 comprises two independent radio frequency systems RF1, RF2 relating to two different transmission channels connected to one and the same remote control and telemetry module TMTC 30. The remote control and telemetry module 30, common to the two systems RF1, RF2, may if necessary comprise a single physical address for all the remote control TC and telemetry TM signals relating to the two systems RF1, RF2. The routing and the management of the signals dedicated to each of the systems RF1, RF2 are carried out inside the remote control and telemetry module 30 by a dedicated electronic device, for example of the ASIC type. The remote control and telemetry module 30 communicates with a ground station by means of a payload 70 comprising a transceiver associated with a system of transmission and reception antennas placed on the platform of the satellite. The remote control and telemetry module 30 communicates with the satellite platform via a serial or parallel communication bus schematized by an input 31 designed to receive all the remote control signals dedicated to the two systems RF1, RF2 and originating from the ground station, at an output 32 designed to transmit to the ground station all the telemetry signals originating from the measurements made by the two systems RF1, RF2.

Each system RF1, RF2 comprises a channel-amplifier module 10, 20 comprising a radiofrequency input 12, 22 designed to receive radiofrequency signals in a predetermined frequency band, and if necessary a linearizer 11, 21 comprising a radiofrequency output 13, 23 connected to a traveling wave tube TWT responsible for amplifying the signals that are received on the channel corresponding to said system RF1, RF2, and that will be retransmitted to the ground via the transmission antennas.

Figure 2:
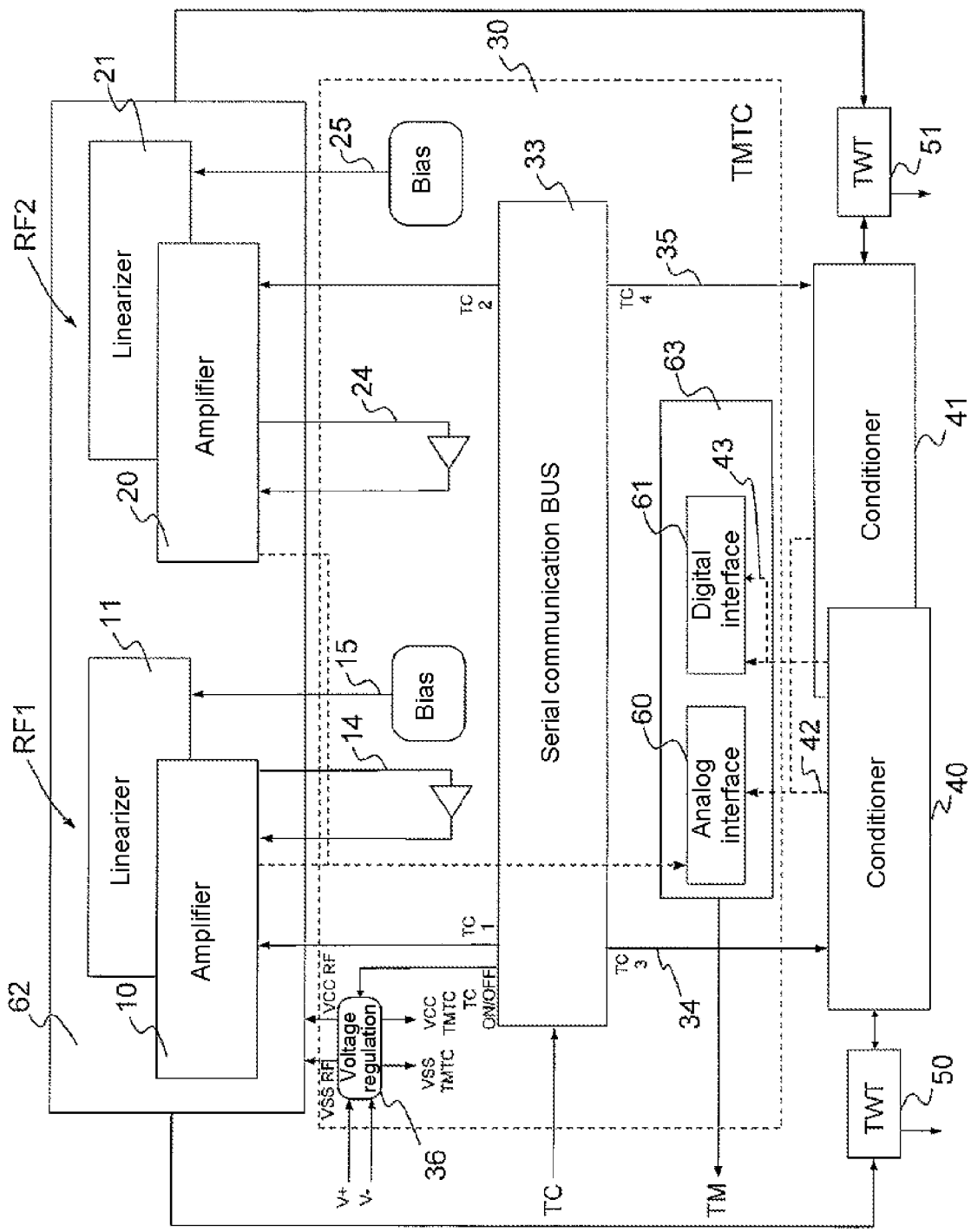
FIG. 2: a detailed diagram of the linearizer-channel amplifier device for the dual RF channel according to the invention.

As shown in FIG. 2, the remote control and telemetry module 30 comprises a serial or parallel communication bus 33 that is common to the two systems RF1, RF2. If necessary, this makes it possible, for one and the same number of subscribers, to have a single address and a single interface for these two systems RF1, RF2, to reduce the number of components of the remote control and telemetry module and the number of connections between the items of equipment and therefore to simplify the link harness allowing the connections between the items of equipment. This also makes it possible, for an equivalent harness complexity, to double the overall capacity in terms of number of subscribers.

The remote control and telemetry module 30 may also be designed to control two simple electronic power conditioners 40, 41, or a single dual electronic power conditioner with two traveling wave tubes TWT 50, 51 associated with each system RF1, RF2. The interfaces between the remote control and telemetry module 30 and the electronic conditioners 40, 41 are schematized by the two remote control outputs 34, 35. Similarly, the remote control and telemetry module 30 also comprises a management system 63 for managing the telemetries of each power conditioner 40, 41 or of the dual power conditioner, schematized by the telemetry outputs 42, 43 connected to the input of an analog interface 60 and of a digital or logical interface 61. The two interfaces 60, 61 form part of the remote control and telemetry module 30 and make it possible to transmit the specific telemetries of each power conditioner 40, 41 to the ground station by means of the remote control and telemetry module 30.

From a functional point of view, the remote control and telemetry module 30 comprises a set of electronic components making it possible, for example, to perform the digitization of the analog telemetries of the two channel-amplifier modules 10, 20 and the corresponding power conditioner(s) 40, 41, to manage the remote controls TC1, TC2, TC3, TC4 dedicated to the configuration of the two channel-amplifier modules 10, 20 and of the one or two corresponding power conditioners 40, 41, if necessary to regulate the output power of the two channel-amplifier modules 40, 41 by means of corresponding gain regulation loops 14, 24, to provide the power supply voltages 36 to the two systems RF1, RF2 and to provide the bias 15, 25 of the two linearizers 11, 21.

A maximum of functions and therefore of electronic components are shared in order to reduce the associated cost. The two systems RF1, RF2 are independent and can be controlled independently of one another, so the configurations of the two systems RF1, RF2 may be completely different. Advantageously, the two systems RF1 and RF2 may be incorporated into one and the same housing 62.

Although the invention has been described in connection with particular embodiments, it is evident that it is in no way limited thereto and that it includes all the technical equivalents of the means described and their combinations if the latter enter into the context of the invention.

The invention claimed is:

1. A linearizer-channel amplifier device for a dual RF channel designed to be installed on a telecommunication satellite, comprising:
two independent radiofrequency channels, each radiofrequency channel corresponding to a radiofrequency-signal communication channel and including a channel-amplifier module, the two independent radiofrequency channels being directly connected to a remote control and telemetry module configured to provide routing and management of remote control and telemetry signals dedicated to each of the two independent radiofrequency channels, the remote control and telemetry module comprises a serial or parallel communication bus that is common to the two independent radiofrequency channels for one and the same number of subscribers, to have a single address and a single interface for the two independent radiofrequency channels, to reduce the number of components of the remote control and telemetry module, to simplify a link harness allowing connections between item equipment, and to double an overall capacity in terms of a number of subscribers.

2. The device as claimed in claim 1, wherein the remote control and telemetry module provides the routing and the management of the remote control and telemetry signals dedicated to each of the two channel-amplifier modules and provides management of telemetries produced by the two channel-amplifier modules.

3. The device as claimed in claim 2, wherein each radiofrequency channel comprises a linearizer connected to the respective channel-amplifier module and to the remote control and telemetry module and the remote control and telemetry module also manages telemetries produced by the two linearizers in each said radiofrequency channel.

4. The device as claimed in claim 1, wherein the remote control and telemetry module also further comprises remote control outputs connected to an input of a dual electronic power conditioner connected to two traveling wave tubes associated with each radiofrequency channel.

5. The device as claimed in claim 4, wherein the remote control and telemetry module further comprises a management system for managing analog and digital telemetries of the dual electronic power conditioner via one or more dedicated interfaces.

6. The device as claimed in claim 1, wherein the remote control and telemetry module further comprises remote control outputs connected respectively to inputs of two electronic power conditioners connected respectively to two traveling wave tubes associated with each radiofrequency channel.

7. The device as claimed in claim 6, wherein the remote control and telemetry module further comprises a management system for managing analog and digital telemetries of each electronic power conditioner via one or more dedicated interfaces.

8. A telecommunication satellite, comprising at least one linearizer-channel amplifier device for a dual RF channel as claimed in claim 1.

* * * * *